United States Patent
Alexanian et al.

(10) Patent No.: US 12,283,736 B2
(45) Date of Patent: Apr. 22, 2025

(54) PCB TUNING FOR WAVEGUIDE ANTENNAE

(71) Applicant: Magna Electronics, LLC, Southfield, MI (US)

(72) Inventors: Angelos Alexanian, Lexington, MA (US); Konstantinos Konstantinidis, Schweinfurt (DE)

(73) Assignee: Magna Electronics, LLC, Southfield, MI (US)

( * ) Notice: Subject to any disclaimer, the term of this patent is extended or adjusted under 35 U.S.C. 154(b) by 457 days.

(21) Appl. No.: 17/703,872

(22) Filed: Mar. 24, 2022

(65) Prior Publication Data
US 2023/0307814 A1 Sep. 28, 2023

(51) Int. Cl.
*H01P 3/12* (2006.01)
*G01S 7/03* (2006.01)
(Continued)

(52) U.S. Cl.
CPC .............. *H01P 3/121* (2013.01); *G01S 7/032* (2013.01); *H01Q 13/10* (2013.01); *H01Q 13/18* (2013.01);
(Continued)

(58) Field of Classification Search
CPC ........ H01P 3/121; H01P 1/2005; H01P 3/123; G01S 7/032; G01S 13/931; G01S 7/03;
(Continued)

(56) References Cited

U.S. PATENT DOCUMENTS

| | | | |
|---|---|---|---|
| 2,990,547 | A | 6/1961 | McDougal |
| 3,231,894 | A | 1/1966 | Nagal |

(Continued)

FOREIGN PATENT DOCUMENTS

| | | |
|---|---|---|
| CN | 102931492 | 2/2015 |
| CN | 105633585 | 6/2016 |

(Continued)

OTHER PUBLICATIONS

Pucci, E., Rajo-Iglesias, E., & Kildal, P.-S. (2012). New Microstrip Gap Waveguide on Mushroom-Type EBG for Packaging of Microwave Components. IEEE Microwave and Wireless Components Letters, 22(3), 129a131. https://doi.org/10.1109/LMWC.2011.2182638 (Year: 2012).*

(Continued)

*Primary Examiner* — Vladimir Magloire
*Assistant Examiner* — Remash R Guyah
(74) *Attorney, Agent, or Firm* — Matthew D. Thayne; Thayne and Davis LLC

(57) ABSTRACT

RADAR sensor assemblies/modules, particularly those for vehicles. In some embodiments, the assembly may comprise a waveguide comprising a waveguide groove defined by opposing waveguide groove structures. An antenna structure may be operably coupled with the waveguide. A printed circuit board may be operably coupled with the waveguide and may comprise an electrically conductive top layer, an electrically conductive bottom layer, and a substrate positioned in between the electrically conductive top layer and the electrically conductive bottom layer. The electrically conductive top layer may comprise an opening exposing the substrate, which opening may extend along the waveguide groove in between the opposing waveguide groove structures. This configuration may allow for various parameters of the printed circuit board to be modified to tune a performance of a sensor/antenna.

20 Claims, 6 Drawing Sheets

(51) Int. Cl.
*H01Q 13/10* (2006.01)
*H01Q 13/18* (2006.01)
*H05K 1/02* (2006.01)
*H05K 1/11* (2006.01)
*G01S 13/931* (2020.01)
*H01P 3/123* (2006.01)

(52) U.S. Cl.
CPC ........... *H05K 1/0237* (2013.01); *H05K 1/115* (2013.01); *G01S 13/931* (2013.01); *H01P 3/123* (2013.01); *H05K 2201/10151* (2013.01)

(58) Field of Classification Search
CPC ........ G01S 13/93; H01Q 13/10; H01Q 1/526; H01Q 13/18; H01Q 13/22; H01Q 1/3233; H01Q 13/0233; H01Q 21/0043; H05K 1/0237; H05K 1/115; H05K 2201/10151; H05K 2201/09118; H05K 1/0236
USPC .................................................. 342/70, 175
See application file for complete search history.

(56) References Cited

U.S. PATENT DOCUMENTS

| | | | |
|---|---|---|---|
| 6,483,481 | B1 | 11/2002 | Sievenpiper et al. |
| 7,132,905 | B2 | 11/2006 | Sano |
| 8,058,998 | B2 | 11/2011 | Burnside et al. |
| 8,779,995 | B2 | 7/2014 | Kirino et al. |
| 8,803,638 | B2 | 8/2014 | Kildal |
| 9,153,851 | B2 | 10/2015 | Nakamura |
| 9,252,475 | B2 | 2/2016 | Milyakh et al. |
| 9,666,931 | B2 | 5/2017 | Suzuki |
| 10,090,600 | B2 | 10/2018 | Kirino et al. |
| 10,164,344 | B2 | 12/2018 | Kirino et al. |
| 10,327,364 | B2 | 6/2019 | Oishi et al. |
| 10,381,741 | B2 | 8/2019 | Kirino et al. |
| 2003/0117245 | A1 | 6/2003 | Okajima et al. |
| 2004/0066346 | A1 | 8/2004 | Huor |
| 2007/0152868 | A1 | 7/2007 | Schoebel |
| 2009/0153432 | A1 | 6/2009 | Manasson et al. |
| 2011/0043423 | A1 | 2/2011 | Kirino et al. |
| 2011/0050356 | A1 | 3/2011 | Nakamura et al. |
| 2012/0068900 | A1* | 3/2012 | Yatabe .................. H01Q 13/10 343/767 |
| 2014/0354498 | A1 | 12/2014 | Balma et al. |
| 2016/0020522 | A1 | 1/2016 | Sano et al. |
| 2016/0254582 | A1 | 9/2016 | Jensen |
| 2017/0040703 | A1 | 2/2017 | Cheng et al. |
| 2017/0084971 | A1 | 3/2017 | Kildal et al. |
| 2017/0187121 | A1 | 6/2017 | Kirino et al. |
| 2017/0279193 | A1 | 9/2017 | Chauloux |
| 2018/0013208 | A1 | 1/2018 | Izadian et al. |
| 2018/0269591 | A1 | 9/2018 | Kirino et al. |
| 2018/0301816 | A1 | 10/2018 | Kamo et al. |
| 2018/0351261 | A1 | 12/2018 | Kamo et al. |
| 2019/0379136 | A1 | 12/2019 | Kirino et al. |
| 2020/0194900 | A1 | 6/2020 | Doyle et al. |
| 2021/0028527 | A1* | 1/2021 | Doyle .................... H01Q 13/18 |
| 2021/0028528 | A1* | 1/2021 | Alexanian ............ H01Q 1/3233 |
| 2021/0028529 | A1* | 1/2021 | Doyle .................... G01S 13/931 |
| 2021/0028549 | A1* | 1/2021 | Doyle .................. H01Q 21/005 |
| 2021/0210865 | A1 | 7/2021 | Li et al. |
| 2023/0223671 | A1* | 7/2023 | Vosoogh .............. H01Q 21/064 333/204 |

FOREIGN PATENT DOCUMENTS

| | | |
|---|---|---|
| CN | 106207357 | 12/2016 |
| EP | 2267841 | 12/2010 |
| SE | 543704 C2 | 6/2021 |
| WO | 2017078183 | 5/2017 |
| WO | 2019022651 | 1/2019 |
| WO | 2021122725 | 6/2021 |

OTHER PUBLICATIONS

Rajo-Iglesias, E., & Kildal, P. (Feb. 2011). Numerical studies of bandwidth of parallel-plate cut-off realised by a bed of nails, corrugations and mushroom-type electromagnetic bandgap for use in gap waveguides. IET Microwaves, Antennas & Propagation, 5(3), 282-289. (Year: 2011).*
Sievenpiper, D., Lijun Zhang, Broas, R. F. J., Alexopolous, N. G., & Yablonovitch, E. (1999). High-impedance electromagnetic surfaces with a forbidden frequency band. IEEE Transactions on Microwave Theory and Techniques, 47(11), 2059â2074. https://doi.org/10.1109/22.798001 (Year: 1999).*
Skobelev, S. P., & Kildal, P.-S. (2005). Mode-matching modeling of a hard conical quasi-TEM horn realized by an EBG structure with strips and vias. IEEE Transactions on Antennas and Propagation, 53(1), 139â143. https://doi.org/10.1109/TAP.2004.840417 (Year: 2005).*
CN102931492, Feb. 11, 2015, Beijing Institute of Telemetry Technology, Machine Translation (9 pages).
CN106207357, Dec. 7, 2016, Chengdu Xanaway Technology Co., Ltd., Machine Translation (58 pages).
Goussetis, G. et al., Tailoring the AMC and EBG characteristics of periodic metallic arrays printed on grounded dielectric substrate, IEE Transactions on Antennas and Propagation, vol. 54, No. 1, Jan. 2006 (8 pages).
Zhang, Y. et al., Planar Artificial Magnetic Conductors and Patch Antennas, IEE Transactions on Antennas and Propagation, vol. 51, No. 10, Oct. 2003 (9 pages).
Mosallaei, H., et al., Antenna Miniaturization and Bandwidth Enhancement Using a Reactive Impedance Substrate, IEE Transactions on Antennas and Propagation, vol. 52, No. 9, Sep. 2004 (12 pages).
Jun. 26, 2023—PCT/US23/15571—International Search Report & Written Opinion (7 pgs).

* cited by examiner

PCB TUNING FOR WAVEGUIDE ANTENNAE

SUMMARY

Disclosed herein are various embodiments of sensor, waveguide, and/or antenna assemblies, such as RADAR sensor assemblies for vehicles. Some such assemblies are manufactured using parts and/or techniques that can be expensive and time consuming to reconfigure, which makes correction and/or tuning of performance of the assembly difficult.

For example, some waveguide/antenna assemblies may be formed by diecasting or injection molding. Machining imperfections during such processes can result in a detuned antenna and a corresponding loss of performance. Again, corrections for such imperfections may be costly, time consuming, and difficult, in some cases prohibitively so.

The present inventors have therefore determined that it would be desirable to provide apparatus, systems, and methods that overcome one or more of the foregoing limitations and/or other limitations of the prior art. In an example of a method for tuning a waveguide and/or antenna assembly according to some implementations, the method may comprise modifying a printed circuit board of the assembly to tune a performance of the antenna/waveguide/sensor. In some implementations, the assembly may comprise a unitary body, such as a block formed by diecasting or injection molding, that itself contains/comprises the waveguide structures and the antenna structures of the assembly. The printed circuit board may therefore comprise a layer of the assembly coupled to the body/block.

The modification of the printed circuit board to tune the assembly may comprise, for example, replacing the printed circuit board with a new printed circuit board comprising one or more different parameters/tuning characteristics, such as one or more of a different length and/or width of an opening in the printed circuit board exposing a substrate of the printed circuit board, a different thickness and/or dielectric constant of the substrate, a different length and/or width of a cavity formed in the substrate adjacent to the opening, and a different shape/size, and/or pattern of a series of structures formed within the opening and substrate, such as electromagnetic band-gap (EBG) structures, which may be exposed through the opening and extend to a lower metallic and/or otherwise conductive bottom layer of the printed circuit board.

In an example of a waveguide antenna assembly according to some embodiments, the assembly may comprise a waveguide comprising a waveguide groove defined by opposing waveguide groove structures and an antenna structure operably coupled with the waveguide. In some embodiments, the waveguide and the antenna structure may both be formed in a single, unitary structure, such as a diecast waveguide antenna block and an injection molded waveguide antenna block.

The assembly may further comprise a printed circuit board operably coupled with the waveguide. The printed circuit board may comprise an electrically conductive top layer, an electrically conductive bottom layer, and a substrate positioned in between the electrically conductive top layer and the electrically conductive bottom layer. The electrically conductive top layer may comprise an opening exposing the substrate, which opening may extend along the waveguide groove in between (but, in some embodiments, in an adjacent dimension and/or plane rather than directly in between in the same plane/dimension; in other words, for purposes of this disclosure, an opening may extend "in between" another structure, such as an adjacent waveguide groove, even though the opening is formed in a structure located in an adjacent plane relative to structure defining the waveguide groove) the opposing waveguide groove structures.

In some embodiments, the waveguide and antenna structure are configured to be coupled with a plurality of different printed circuit boards to adjust one or more performance characteristics of the waveguide antenna assembly by adjusting one or more parameters of a printed circuit board to which the waveguide and antenna structure are coupled. In some such embodiments, the one or more parameters may comprise one or more of a dielectric constant of the substrate, a width of the opening exposing the substrate, a length of the opening exposing the substrate, and a thickness of the substrate.

Some embodiments may further comprise a cavity formed in the printed circuit board. The cavity may be at least partially defined by the electrically conductive bottom layer and on opposing sides of the cavity by one or more electrically conductive structures coupling the electrically conductive bottom layer with the electrically conductive top layer. In some such embodiments, the one or more electrically conductive structures may comprise a row of adjacent vias defining a via wall.

In some embodiments, the one or more parameters may further comprise at least one of a width of the cavity and a length of the cavity.

In some embodiments, the opposing waveguide groove structures may comprise one or more opposing rows of posts.

Some embodiments may further comprise an array of structures, such as electromagnetic band-gap structures, formed between opposing edges of the opening in the substrate. In some such embodiments, the array of electromagnetic band-gap structures may comprise a plurality of electrically conductive rectangular structures positioned on a top surface of the substrate and comprising a via extending through the substrate to couple with the electrically conductive bottom layer of the printed circuit board.

In some embodiments, and related methods, the waveguide and antenna structure may be configured to be coupled with a plurality of different printed circuit boards to adjust one or more performance characteristics of the waveguide antenna assembly by adjusting one or more parameters of a printed circuit board to which the waveguide and antenna structure are coupled. The one or more parameters may therefore comprise one or more of a dielectric constant of the substrate, a width of the opening exposing the substrate, a length of the opening exposing the substrate, a thickness of the substrate, a pattern of the array of electromagnetic band-gap structures, and a shape and/or size of the array of electromagnetic band-gap structures.

Some embodiments may comprise a second opening exposing the substrate. In some such embodiments, conductive strip may extend in between the two openings and/or a waveguide ridge may be formed on the waveguide/antenna structure, which may be positioned to extend along, and in some cases directly above, the conductive strip. In some such embodiments, one or more dimensions of the two openings, collectively or individually, and/or the conductive strip, may be used as another tuning parameter.

In an example of a vehicle sensor antenna assembly according to some embodiments, the assembly may comprise a waveguide block comprising a waveguide groove and an antenna slot extending along an axis of the waveguide groove. The antenna slot may be configured to deliver electromagnetic radiation therethrough as part of a signal for a vehicle sensor. The assembly may further comprise a printed circuit board coupled with the waveguide block and forming a wall of the waveguide groove. The printed circuit board may comprise a first metallic layer; a second metallic layer; a substrate positioned in between the first metallic layer and the second metallic layer; and an elongated opening formed in the first metallic layer adjacent to the waveguide groove to expose the substrate therethrough.

In some embodiments, the printed circuit board may be removably coupleable to the waveguide block to allow any of a plurality of other printed circuit boards having differing characteristics used to tune a performance of the vehicle sensor by changing the characteristics of the printed circuit board alone.

Some embodiments may further comprise a dielectric cavity formed in the substrate. In some such embodiments, the dielectric cavity may be formed, at least in part, by a first row of conductive vias extending between the first metallic layer and the second metallic layer on a first side of the dielectric cavity and a second row of conductive vias extending between the first metallic layer and the second metallic layer along a second side of the dielectric cavity opposite the first side of the dielectric cavity.

In some embodiments, the printed circuit board may be removably coupleable to the waveguide block to allow any of a plurality of other printed circuit boards having differing tuning characteristics used to tune a performance of the vehicle sensor by changing the tuning characteristics of the printed circuit board alone, and the tuning characteristics may comprise one or more of a dielectric constant of the substrate, a width of the elongated opening exposing the substrate, a length of the elongated opening exposing the substrate, a thickness of the substrate, a width of the dielectric cavity, and a length of the dielectric cavity.

Some embodiments may further comprise an array of electromagnetic band-gap structures formed in the elongated opening. In some such embodiments, the array of electromagnetic band-gap structures may comprise a mushroom shape comprising an enlarged head protruding from a surface of the substrate opposite from the second metallic layer and a relatively narrower stem extending through the substrate to the second metallic layer.

In an example of a method for tuning a waveguide antenna according to some implementations, the method may comprise coupling a waveguide block comprising a waveguide groove and an antenna slot extending along an axis of the waveguide groove with a printed circuit board coupled with the waveguide block and forming a wall of the waveguide groove. The printed circuit board may comprise a first metallic layer; a second metallic layer; a substrate positioned in between the first metallic layer and the second metallic layer; and an elongated opening formed in the first metallic layer adjacent to the waveguide groove to expose the substrate therethrough.

The waveguide antenna may then be tuned by removing, replacing, and/or modifying the printed circuit board having one or more differing characteristics configured to tune the performance of the waveguide antenna and/or an associated sensor. For example, in some implementations, this tuning may be done by changing one or more of a dielectric constant of the substrate, a width of one or more openings exposing the substrate, a length of one or more openings exposing the substrate, a thickness of the substrate, a width of a dielectric cavity, a length of the dielectric cavity, a width of a metallic/conductive strip, which may extend below a waveguide ridge in embodiments comprising such a ridge, and a length of the metallic/conductive strip.

The features, structures, steps, or characteristics disclosed herein in connection with one embodiment may be combined in any suitable manner in one or more alternative embodiments.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of apparatus, systems, and methods consistent with various embodiments of the present disclosure is provided below. While several embodiments are described, it should be understood that the disclosure is not limited to any of the specific embodiments disclosed, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure may be best understood by reference to the drawings, wherein like parts may be designated by like numerals. It will be readily understood that the components of the disclosed embodiments, as generally described and illustrated in the figures herein, could be arranged and designed in a wide variety of different configurations. Thus, the following detailed description of the embodiments of the apparatus and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. Additional details regarding certain preferred embodiments and implementations will now be described in greater detail with reference to the accompanying drawings.

Figure 1:
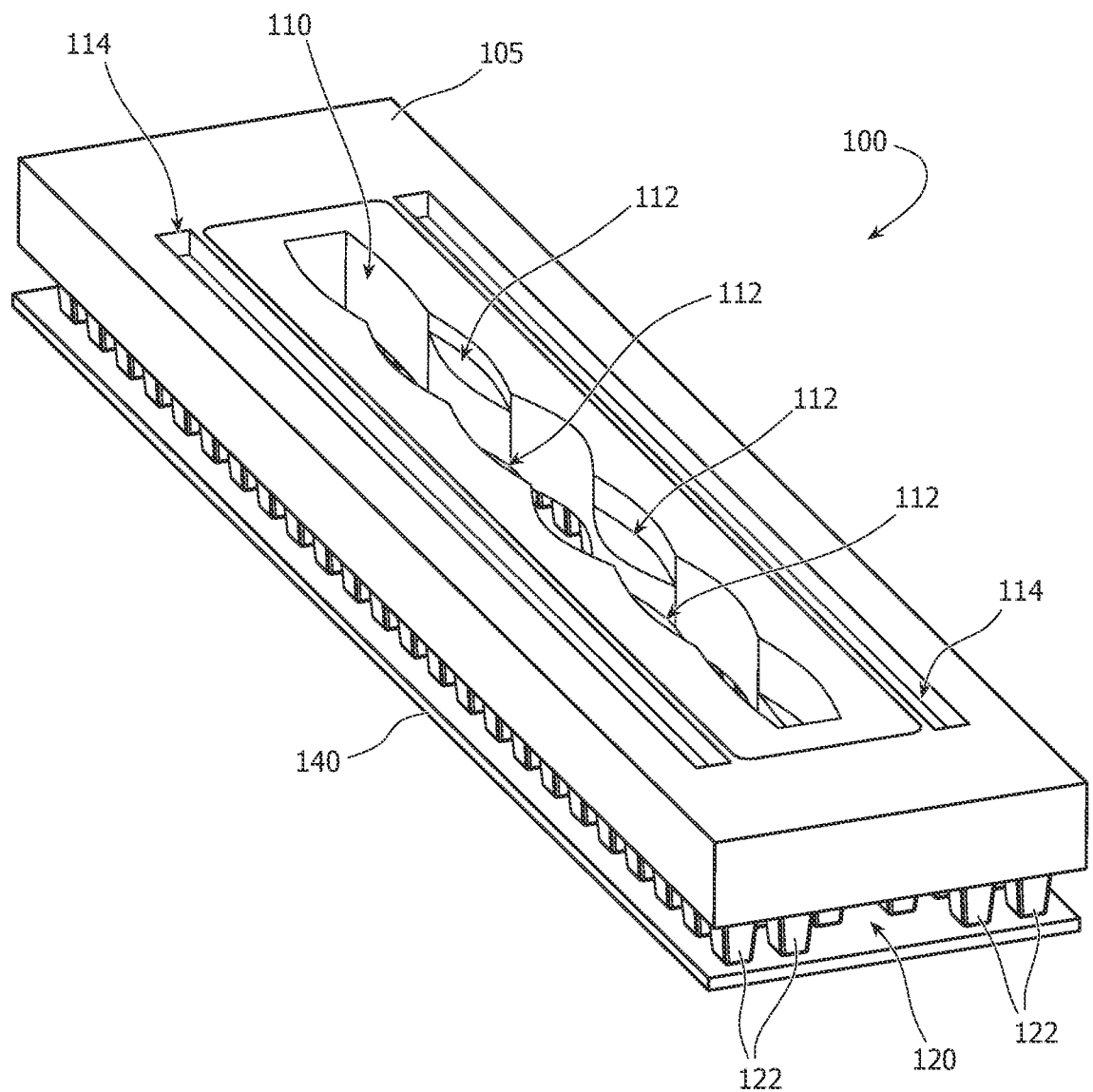
FIG. 1 is a perspective view of a waveguide antenna assembly according to some embodiments.

FIG. 1 depicts a waveguide/sensor/antenna assembly 100, such as a RADAR sensor assembly for a vehicle, that defines, either in whole or in part, one or more waveguides therein. Assembly 100 comprises a portion, such as a layer, casting, and/or block, that comprises and/or defines one or more antenna slots 110 and/or waveguide grooves 120 that are configured to transmit, receive, and/or alter electromagnetic signals.

In the depicted embodiment, the assembly 100 comprises a body 105 containing an antenna slot 110 that extends all the way from one side of the body 105 to the opposite side. This same body 105, which, again, may comprise a block that may be formed, in certain preferred embodiments, by way of a diecasting or injection molding process, also comprises a waveguide 120 formed by a plurality of opposing rows of posts 122 extending from one side of the body/block 105. Any of the various slots, grooves, waveguides, or other structures and/or features described herein may be formed directly into the body 105, such as by way of a die cast mold or the like, or may be formed into one or more layers or other structures coupled to body 105.

Although the waveguide 120 is shown formed from rows of posts 122, it should be understood that the depicted embodiment is but an example and many alternative embodiments are contemplated. For example, although two rows of posts 122 are shown in the depicted embodiment on either side of waveguide 120, a single row of posts on each side may form a waveguide therebetween instead. As another example, rather than forming antenna grooves by way of posts 122, in some embodiments each of the one or more waveguides 120 may comprise a "trench-like" waveguide defined by solid opposing sidewalls. Similarly, although it may be desired for reasons discussed elsewhere herein for the antenna slot(s) 110 to be formed in the same body/block/structure that also forms the waveguide(s), it is contemplated that a separate layer having antenna slots may be used in some embodiments.

The figures also illustrate a variety of preferred, but not required, features. For example, antenna slot 110 is curved or "wavy." More particularly, antenna slot 110 oscillates back and forth between opposing sides of an elongated axis of the antenna slot 110. However, other embodiments are contemplated in which antenna slot 110 is straight. Similarly, in some such embodiments, rather than providing straight waveguide grooves, the waveguide/waveguide groove may be curved and/or wavy.

Assembly 100 further comprises a phase-compensating feature. In the depicted embodiment, this phase-compensating feature is accomplished by applying one or more angled and/or tapered sections, such as tapered grooves or cutouts 112, along one or more of the antenna slots 110. Thus, the depicted embodiment illustrates tapered and/or angled sections/surfaces 112 that are formed along both opposing sidewalls defining the antenna slot 110 at respective points of maxima for the oscillating pattern of the slot 110.

These tapering sections 112 may comprise a stepped taper or ledge or may comprise a smoothly transitioning taper. In other words, a ledge may be formed at the starting point of the taper and therefore, rather than a smooth taper between the outer surface of the structure defining the slot and the starting point of section 112 in between the opposing sides of body 105, the transition of tapering section 112 may be immediate from the starting point, which is at a ledge of section 112 to the outer surface of the structure forming the slot/groove, as shown in the figures.

Alternatively, however, in other embodiments this phase-compensating feature may be formed by using a tapering section that lacks a ledge. In other words, the taper may extend smoothly between the starting point of the feature in between opposing sides of the slot 110 and the outer surface of body 105.

In some embodiments, all of the peaks/maxima of the oscillating pattern of one or more of the slots 110 may comprise a phase-compensating feature, such as a tapering section 112. Alternatively, in some embodiments, only a subset of the peaks/maxima defined by slots 110 may comprise such a feature.

In addition, as previously mentioned, in preferred embodiments, one or more of the slots 110 may intermittently oscillate on opposite sides of its respective elongated axis and/or adjacent waveguide along at least a portion thereof. Thus, in some such embodiments, each of at least a subset of the plurality of the tapering surfaces/sections 112 may be spaced apart in a manner that coincides with the intermittent oscillation of the slots 110. In some such embodiments, all of the tapering surfaces/sections 112 may be spaced apart in a manner that coincides with the intermittent oscillation of the slots 110.

It should be understood, however, that the stepped taper of assembly 100 is but an example for purposes of illustration and that a wide variety of alternative embodiments are contemplated. For example, although only a single step is used in the tapered section 112 of assembly 100, any number of steps may be used in between the one step shown in this embodiment and an effectively infinite number of steps involved in a smooth taper, which may be equivalent to zero steps.

Each of the tapering sections 112 of assembly 100 may comprise a stepped taper extending between a first edge of the ledge formed by tapering section 112, which first edge may be positioned in between the external surface of the structure forming slot 110 and the internal surface of this structure, and a second edge of a concavely curved surface (in some cases, a semi-circular concavely curved surface), the second edge extending along the external surface of the aforementioned structure. Again, any number of intermediate steps may be used as desired.

In preferred embodiments, these sections/surfaces 112 are positioned so as to alternate and be staggered along the opposing slot sidewalls such that each section 112 is positioned at a particular point along the axis of only one sidewall of each respective slot 110. In addition, even more preferably, each section 112 is formed along one of the peaks of each oscillating respective slot 110. Thus, for example, if the slot defines, or at least substantially defines, a sine wave, each of the sections 112 is preferably formed along one of the peaks of the sine wave extending towards the axial center of the slot 110.

In some embodiments, each of the plurality of tapering sections 112 may comprise a first set of tapering surfaces on a first side of each respective slot 110 and a second set of tapering surfaces 112 on a second side of each respective slot 110 opposite the first side. Preferably, the tapering surfaces/sections 112 alternate such that each tapering surface of first set of tapering surfaces is positioned adjacent to one or more tapering surfaces of the second set of tapering surfaces along the axis of each respective slot 110 and each tapering surface of the second set of tapering surfaces is positioned adjacent to one or more tapering surfaces of the first set of tapering surfaces along the axis, again, preferably alternating back and forth across each respective slot 110.

Each of the plurality of tapering surfaces/sections 112 may comprise a curved, tapering surface in some embodiments. Indeed, in the depicted embodiment, each of the tapering surfaces/sections 112 is defined, at least in part, by a semi-circular cutout, which may be formed at the exterior surface of each respective slot 110, as a concave region from the convex region of the curve defined by each respective slot 110, and then may taper down to a corner, edge, or starting point of the taper. Thus, preferably, the tapers of sections 112 do not extend all the way between opposing surfaces of the structure of assembly 100 defining slots 110, but rather start at a point between the opposing surfaces of this structure and extend to the upper/outer portion of slots 110 on the side opposite the aforementioned waveguide 120.

However, in embodiments in which one or more of the tapering sections 112 has a starting point between opposing surfaces of the structure defining the slot(s) 110, it may be desirable from a manufacturing standpoint that the starting point(s) of the tapering sections 112 be sufficiently spaced from the (typically inner) surface from which the slot(s) 110 originates. Thus, in some embodiments, the starting point may be located at a point no less than 20%, or no less than about 20%, of the distance from the lower/inner and/or originating surface of the slot(s) to the upper/outer and/or terminating surface of the slot(s).

As discussed below in connection with later figures, other embodiments are contemplated in which the tapering surfaces/sections 112 may instead be straight or non-curved. In addition, in some embodiments, the curvature of the tapering sections 112 may extend in multiple dimensions. For example, a semi-spherically curved surface may be formed within one or more of these sections 112 if desired. Additional details regarding these phase-compensating features can be found in U.S. patent application Ser. No. 17/370,922 titled PHASE-COMPENSATED WAVEGUIDES AND RELATED SENSOR ASSEMBLIES, the entire contents of which are hereby incorporated by reference herein.

Body 105 further comprises a pair of antenna grooves 114 that are formed adjacent to and on either side of the aforementioned antenna slot 110. Of course, there may be a plurality of antenna slots 110 in some embodiments, and therefore each, or at least a subset, of such antenna slots 110 may comprise corresponding antenna grooves 114 if desired. Alternatively, antenna grooves 114 may, of course, be omitted if desired.

Antenna grooves 114 extend parallel, or in other embodiments at least substantially parallel, to the elongated axis of the adjacent antenna slots 110. Moreover, unlike antenna slots 110, which extend all the way through the structure of assembly 100 in which they are formed (body 105), antenna grooves 114 extend into this structure without extending entirely through the structure (hence, the use of the term "groove" rather than "slot").

Each antenna groove 114 may also at least substantially mimic one or more aspects of the adjacent antenna slots 110, such as having the same, or at least substantially the same, length. Antenna grooves 114 may be configured to isolate the antennae 110 from their surroundings, which may be useful in reducing bearing errors and narrowing the antenna pattern to reduce the field of view. Thus, antenna grooves 114 may be referred to herein as "antenna isolation grooves."

Assembly 100 further comprises a printed circuit board 140. Printed circuit board 140, as better shown in later drawings, comprises a first surface 142 and a second surface 144 opposite the first surface, both of which preferably comprise conductive and/or metallic layers of a multi-layered PCB assembly. Also, preferably, printed circuit board 140 comprises a layered structure comprising a dielectric substrate sandwiched in between opposing conductive/metallic layers. Because the printed circuit board is typically much easier and less expensive to replace than the other elements of assembly 100, the present inventors have discovered that, by using techniques to tune the performance of the antenna that are incorporated solely within the printed circuit board 140, new printed circuit boards 140 can readily be produced to improve performance of a sensor, for example, by altering the configuration of the printed circuit board rather than altering the features of the body 105, which may be much more difficult, time consuming and expensive since this may require creation of a new diecasting or injection molding tool.

Figure 2:
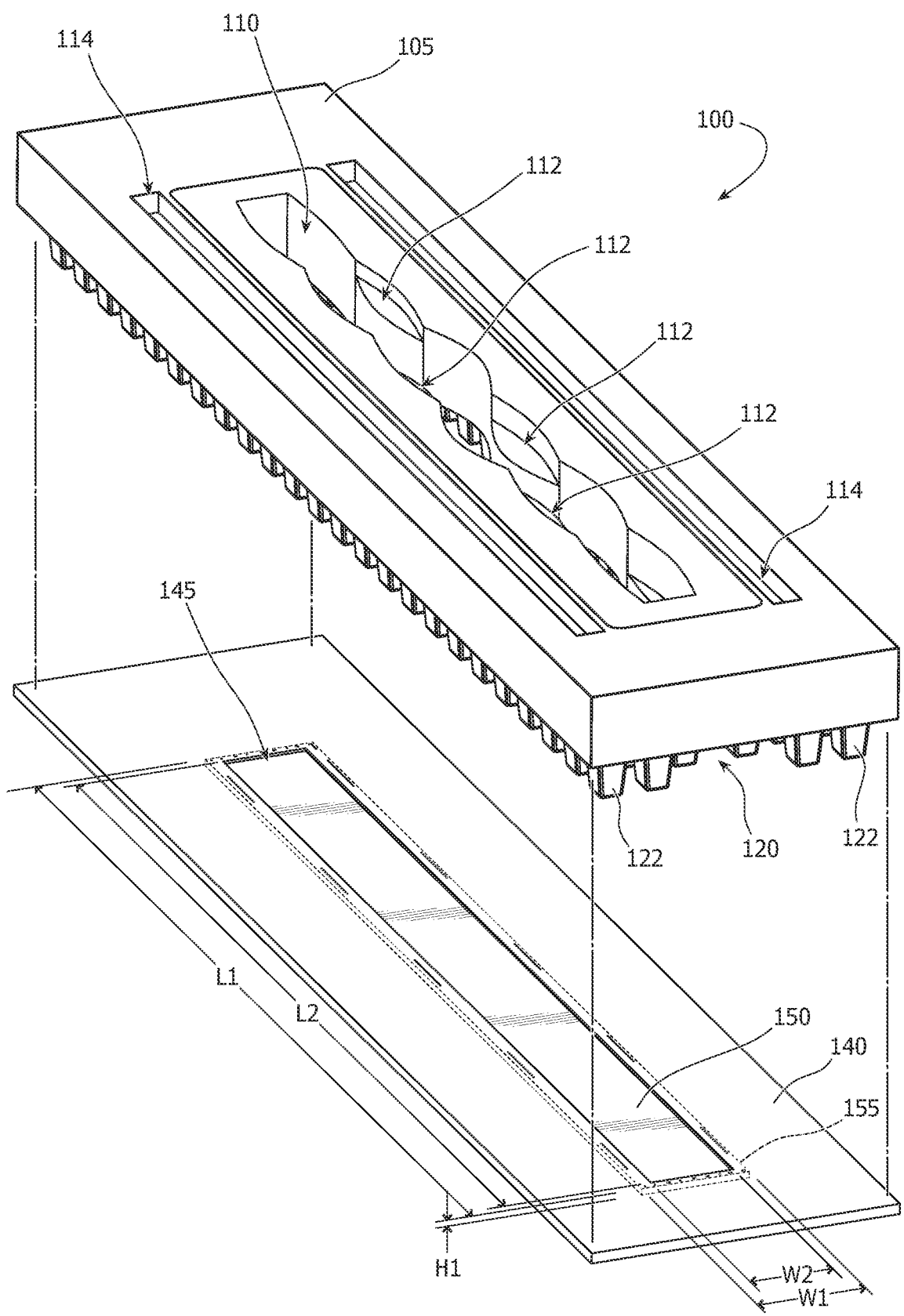
FIG. 2 is an exploded view of the waveguide antenna assembly.

FIG. 2 is an exploded view of assembly 100 showing some of the configurable features of the tunable printed circuit board 140. In particular, this figure illustrates the presence of an opening 145 in the upper metallic layer of the printed circuit board 140 to expose the substrate 150 that is, as previously mentioned, sandwiched between opposing conductive/metallic layers. Preferably, opening 145 is formed and positioned so as to extend adjacent to and along the waveguide groove 120 in between the opposing waveguide groove structures, which are, in the depicted embodiment, posts 122. In some such embodiments, the opening 145 may be centered, or at least substantially centered, with respect to the adjacent waveguide 120 such that the center of the opening 145 in one or both directions corresponds, or at least substantially corresponds, with the center of the waveguide 120 in one or both directions.

It should also be understood that, because the adjacent waveguide 120 is straight, opening 145 is straight. However, in embodiments in which the waveguide(s) are instead curved and/or wavy, the opening formed in the printed circuit board may instead be curved and/or wavy, preferably to follow/match, or at least substantially follow/match, the path/shape of the waveguide/waveguide groove.

FIG. 2 also illustrates the presence of a cavity 155 formed in the printed circuit board 140 adjacent to the opening 145. Cavity 155 may be defined, at least in part, by the electrically conductive bottom layer 144 (see FIG. 3) of the printed circuit board 140 and may be defined on opposing sides of the cavity 155 by one or more electrically conductive structures coupling the electrically conductive bottom layer 144 of the printed circuit board 140 with the electrically conductive top layer 142. As will be shown in later figures and discussed below, in the depicted embodiment, these electrically conductive structures comprise vias defining a via wall. However, it is contemplated that they may instead be defined by a solid conductive wall in other embodiments.

FIG. 2 further illustrates various dimensions that may be altered to tune the performance of the assembly 100 by only changing features of the printed circuit board 140. For example, distance L1 is the length of the cavity 155 and distance W1 is the width of the cavity 155. Similarly, distance L2 is the length of the opening 145 formed in the printed circuit board 140 and distance W2 is the width of the opening 145. And distance H1 is the thickness of the substrate 150 of the printed circuit board 140. Any of these dimensions may be altered without changing anything about the block/body 105 of assembly 100 and may therefore be considered "tuning characteristics" for purposes of this disclosure. In addition to these dimensions, the dielectric constant of the substrate 150 and, in other embodiments (see FIGS. 4 and 5 and corresponding discussion below), a pattern of various elements within the printed circuit board 140, such as electromagnetic band-gap (EBG) structures, may be used to tune the performance of the antenna as desired, again, without requiring that anything about the waveguides and/or antenna slots themselves be changed.

It may be desirable in some embodiments to avoid increasing distance W2 beyond the width of the waveguide groove to maintain contact and/or adjacent placement between the waveguide posts (or other waveguide groove structures) and a metallic layer of the printed circuit board.

Figure 3:
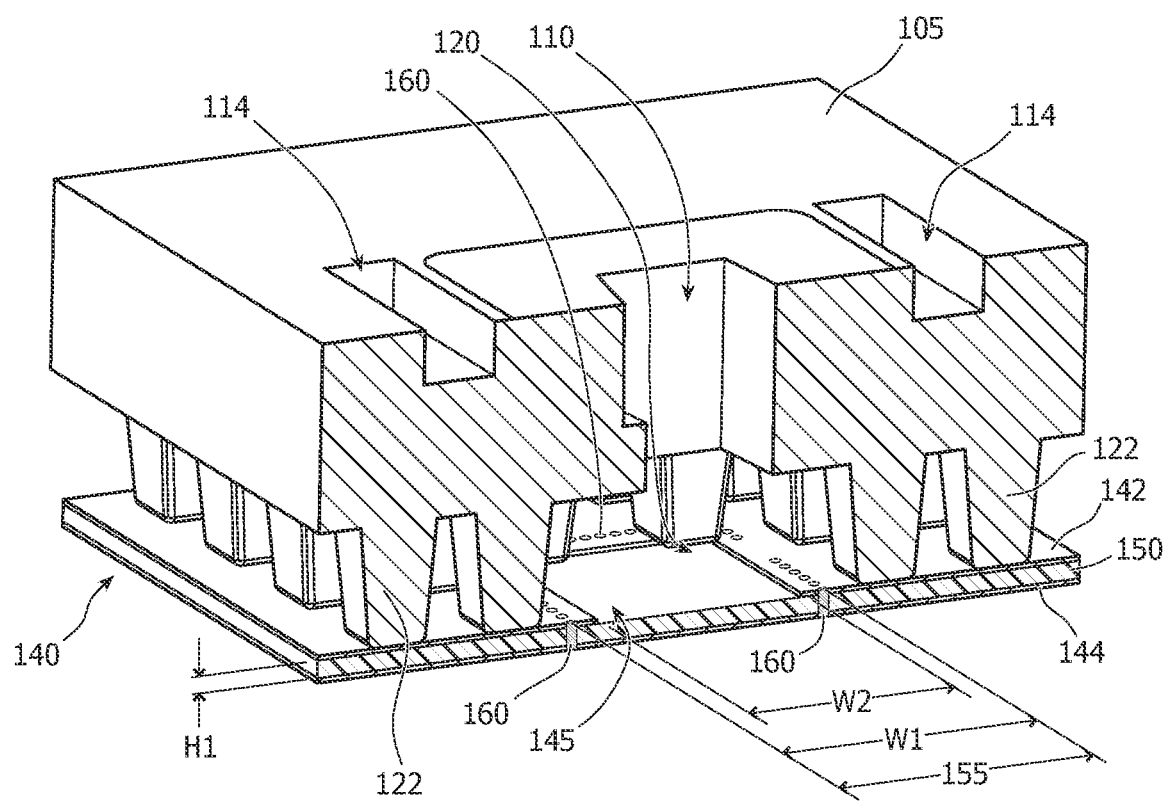
FIG. 3 is a cross-sectional view of the waveguide antenna assembly showing the structure of a cavity formed within a substrate of a printed circuit board of the assembly.

FIG. 3 is a cross-sectional view of assembly 100 illustrating with additional clarity some of the features and characteristics of printed circuit board 140. For example, the cross-section of FIG. 3 is taken through two vias 160 defining the aforementioned via wall that, in the depicted embodiment, defines boundaries on four sides of a cavity 155 within which a PCB substrate 150/dielectric material may be contained. Again, in the depicted embodiment, substrate 150 extends within the cavity 155 and on the outside of cavity 155, but it should be understood that, in some embodiments, substrate 150 may only be positioned within the cavity 155 and/or the walls of the cavity 155 may instead by defined by a continuous structure, such as a solid wall comprising an electrically conductive material rather than a series of spaced vias 160.

FIG. 3 further illustrates some of the aforementioned tuning characteristics or parameters with better clarity. For example, it can be seen that thickness H1 is defined in between the top layer 142 and the bottom layer 144 of printed circuit board 140. Similarly, the dimensions of W1 and W2 are more apparent in this figure. W1 is defined between opposing vias 160 that, as mentioned above, define the width of the cavity 155. Again, this dimension may be defined between opposing continuous walls in other embodiments. W2 is defined between opposing sides/edges of the opening 145 and is therefore somewhat less than W1. Similarly, although not shown in FIG. 3, because L2 is defined between opposing sides/edges of the opening 145 along the direction corresponding to the axis of the waveguide 120 rather than between opposing sides of the waveguide 120, it is somewhat less than L1, which is defined between a via wall or another structure connecting the upper and lower conductive layers, 142 and 144, respectively, of the printed circuit board 140.

Figure 4:
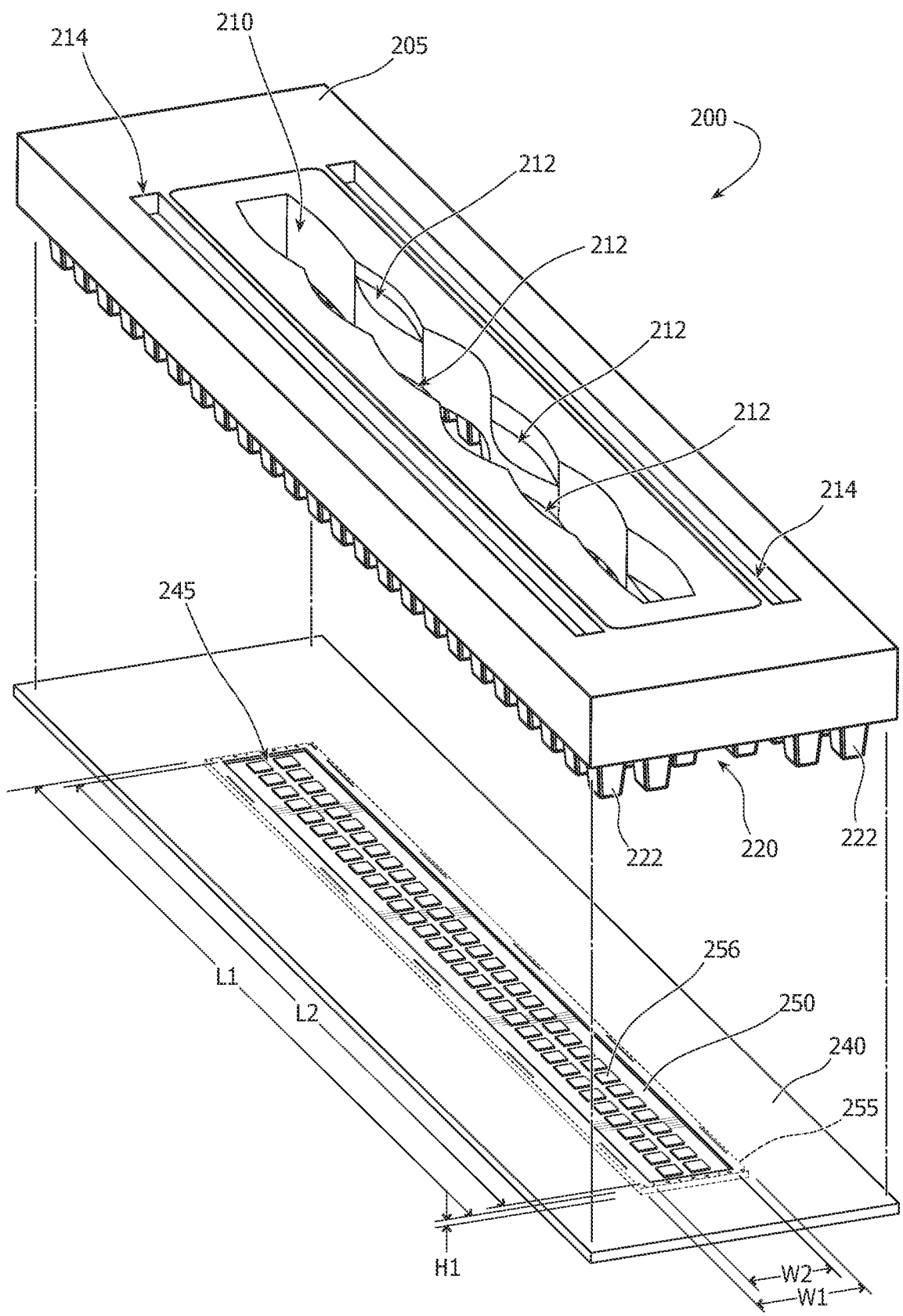
FIG. 4 is an exploded view of a waveguide antenna assembly according to other embodiments.
Figure 5:
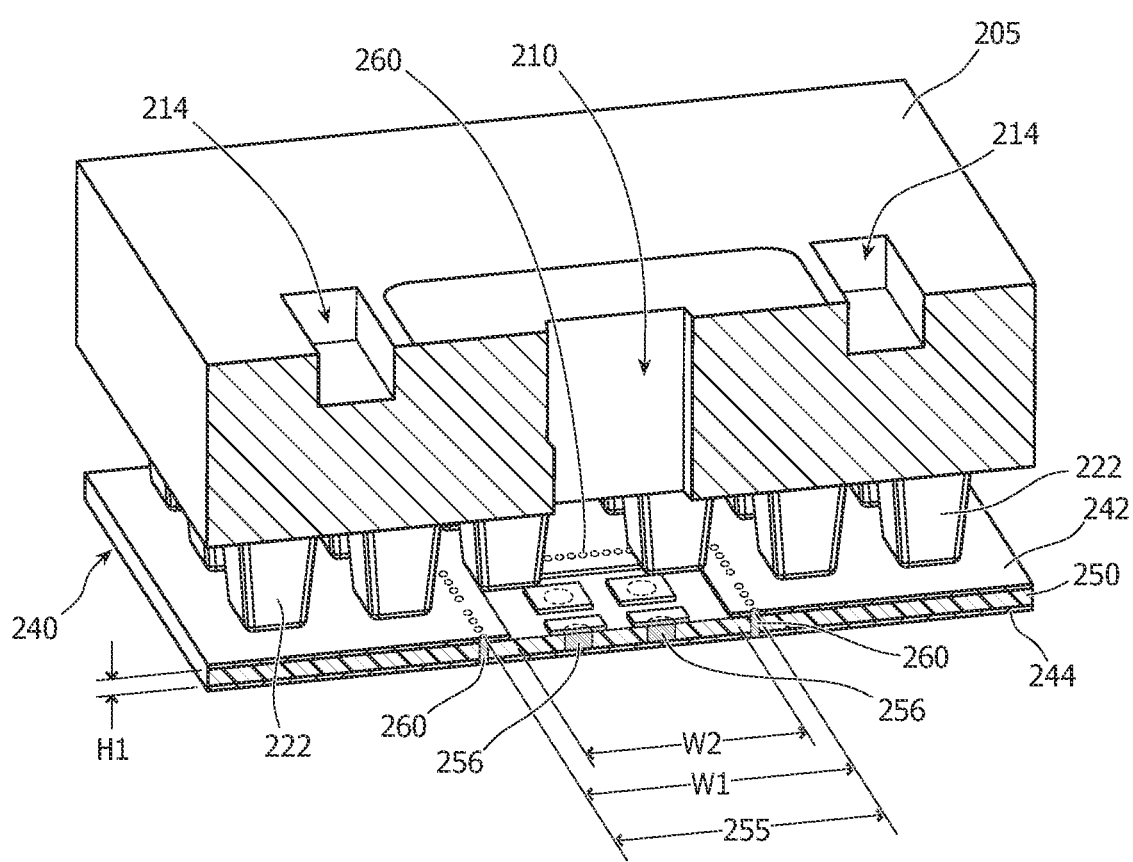
FIG. 5 is a cross-sectional view of the waveguide antenna assembly of FIG. 4.

FIGS. 4 and 5 illustrate views similar to FIGS. 2 and 3, respectively, of an alternative embodiment of a waveguide/sensor/antenna assembly 200, such as a RADAR sensor assembly for a vehicle, that defines, either in whole or in part, one or more waveguides therein. Like assembly 100, assembly 200 comprises a body 205, such as a layer, casting, and/or block, that comprises and/or defines one or more antenna slots 210, each of which may be operably coupled with a corresponding waveguide groove 220 to deliver electromagnetic signals therethrough.

Body 205 again comprises a waveguide 220 formed by a plurality of opposing rows of posts 222 extending from one side of the body/block 205, but other waveguide structures, such as a "trench-like" waveguide defined by solid opposing sidewalls, may be used instead. Antenna slot 210 also oscillates back and forth between opposing sides of an elongated axis of the antenna slot 210 but, again, this is just an example and need not be the case for all contemplated embodiments. Body 205 further comprises a pair of optional antenna grooves 214 that are formed adjacent to and on either side of the aforementioned antenna slot 210.

Assembly 200 also comprises an optional phase-compensating feature, which may comprise a series of tapered and/or stepped grooves or cutouts 212 formed at specific locations along portions of opposing sides of antenna slot 210. These sections 212 may comprise a stepped taper or ledge or may comprise a smoothly transitioning taper and may comprise any of the features and/or structures described above in connection with sections 112 of assembly 100.

Assembly 200 further comprises a printed circuit board 240, which differs from the printed circuit board 140 of assembly 100. More particularly, printed circuit board 240 comprises a pattern of structures positioned within the region of substrate 250 corresponding with opening 245. In the depicted embodiment, which is but an example of a series or pattern of such structures, these structures comprise electromagnetic band-gap (EBG) structures 256. As another example, in some embodiments, printed metallo-dielectric surfaces may be used to effectively change the permittivity. Such elements may be used, for example, as partially reflective surfaces that can alter the reflection coefficient/impedance of the dielectric. This may allow for avoiding the need to ground these elements, which may allow for higher tuning ranges.

Typically, the use of periodic and/or patterned structures 256 will increase the effective dielectric constant within the waveguide groove and therefore lower the frequency of operation. Thus, if the waveguide/antenna is tuned at a higher than desired frequency, the substrate opening, either with or without structures 256, may be used to tune the waveguide/antenna response back down the desired band. Typically, the use of structures 256 will lower the frequency more than just providing an opening 145 and/or cavity 155.

These structures and/or their pattern may be altered in various ways to serve as another of the possible tuning parameters or characteristics of the printed circuit board 240 that may be used to tune the performance of the antenna and/or sensor without changing the body/block 205, waveguide 220, and/or antenna slot 210. For example, structures 256 are formed in a repeating pattern that may be varied by, for example, changing the spacing between adjacent structures 256 in one or more directions, the spacing between structures 256 and the adjacent edge of opening 245, or the size and/or shape of structures 256. For example, as best shown in the cross-sectional view of FIG. 5, in the depicted embodiment, EBG structures 256 comprise a mushroom-like shape having an enlarged head protruding from a surface of the substrate 250 exposed by opening 245 and a narrower stem extending through the substrate 250 to connect to the lower layer 244 of printed circuit board 240 opposite from layer 242.

Various aspects of these periodic elements, including but not limited to the depicted EBG structures 256, may be modified as desired to tune the performance of the antenna/sensor and/or allow for use of alternative waveguide block designs. Indeed, placing grounded or ungrounded printed periodic features within an opening in a printed circuit board can lead to broader tuning and additional design freedom than obtained only use of just the opening. For example, by varying their size, or at least a portion of their size (such as the mushroom-shaped heads of the EBG structures 256, for example), and/or the distance of separation of the printed surfaces, the lower cutoff frequency may be tuned further downward. These elements may then be used as a tuning mechanism or to expand the design options for the waveguide block, such as, for example, by providing more compact channels or more space between antennas.

Assembly 200 may otherwise be similar to assembly 100 and therefore further comprises a cavity 255 formed in the printed circuit board 240 adjacent to the opening 245. Cavity 255 may be defined, at least in part, by the electrically conductive bottom layer 244 of the printed circuit board 240 and may be defined on opposing sides of the cavity 255 by one or more electrically conductive structures coupling the electrically conductive bottom layer 244 of the printed circuit board 240 with the electrically conductive top layer 242.

In the depicted embodiment, cavity 255 is again defined by a via wall made up of a series of adjacent vias 260 that are spaced apart from the edges of opening 245 and define the boundaries on four sides of cavity 255 within which a PCB substrate 250/dielectric material may be contained. Again, cavity 255 may instead by defined by a continuous structure, such as a solid wall comprising an electrically conductive material rather than a series of spaced vias 260 in alternative contemplated embodiments.

FIGS. 4 and 5 further illustrate various dimensions of assembly 200 similar to those of assembly 100 that may be modified to tune the performance of the assembly 200 by only changing features of the printed circuit board 240. For example, distance L1 is the length of the cavity 255 and distance W1 is the width of the cavity 255. Similarly, distance L2 is the length of the opening 245 formed in the printed circuit board 240 and distance W2 is the width of the opening 245. And distance H1 is the thickness of the substrate 250 of the printed circuit board 240.

Figure 6:
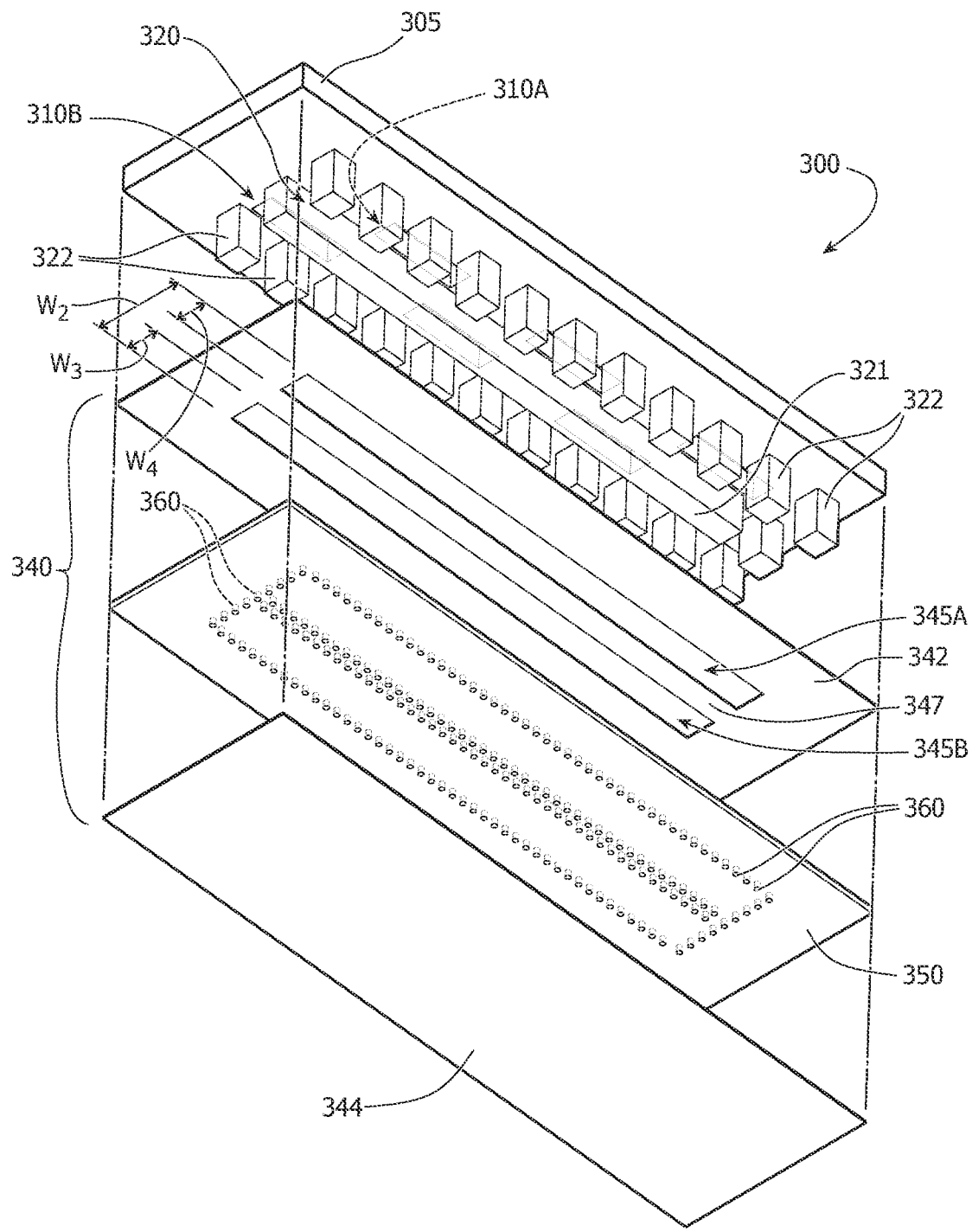
FIG. 6 is an exploded view of a waveguide antenna assembly according to still other embodiments.

FIG. 6 is an exploded view of another alternative embodiment of a waveguide/sensor/antenna assembly 300, such as a RADAR sensor assembly for a vehicle, that defines, either in whole or in part, one or more waveguides therein. Assembly 300 again comprises a body 305, such as a layer, casting, and/or block, that comprises and/or defines one or more antenna slots, each of which may be operably coupled with a corresponding waveguide groove 320 to deliver electromagnetic signals therethrough. However, assembly 300 differs from those previously discussed in that the antenna slots are arranged in two rows 310A/310B and are staggered with respect to one another such that each slot is positioned on an opposite side of the waveguide groove 320 relative to the adjacent slot or slots.

Body 305 again comprises a waveguide 320 formed by opposing rows of posts 322 extending from one side of the body/block 205, but other waveguide structures, such as a "trench-like" waveguide defined by solid opposing sidewalls, may be used instead. Body 305 further comprises a ridge 321, which is preferably centrally, or at least substantially centrally, positioned within the waveguide groove 320 defined by posts 322.

Assembly 300 further comprises a printed circuit board 340, which differs from the printed circuit boards 140/240 of assemblies 100/200. More particularly, printed circuit board 340 comprises a pair of openings 345A/345B in the upper conductive layer 342 of printed circuit board 340 that exposes the substrate 350. A strip 347 of metallic and/or conductive material extends in between the two openings 345A/345B.

Strip 347 may be positioned directly underneath the aforementioned ridge 321 positioned within waveguide groove 320. In some embodiments, strip 347 may have the same, or at least substantially the same, length and/or width, and may be positioned so as to align, or at least substantially align, with the projection/footprint of the waveguide ridge 321. However, it is contemplated that, in other embodiments, one or more of the dimensions of the strip 347 may vary, in some cases compared to the waveguide ridge 321. In fact, as discussed below, one or more of the dimensions of the strip 347 and/or adjacent openings 345A/345B may be used as yet another tuning parameter for the printed circuit board 340.

Assembly 300 may otherwise be similar to assemblies 100 and/or 200 and therefore may further comprise one or more cavities formed in the printed circuit board 340 adjacent to the openings 345A and/or 345B. This cavity or cavities may be defined, at least in part, by the electrically conductive bottom layer 344 of the printed circuit board 340 and may be defined on opposing sides of the cavity/cavities by one or more electrically conductive structures coupling the electrically conductive bottom layer 344 of the printed circuit board 340 with the electrically conductive top layer 342.

In the depicted embodiment of FIG. 6, these cavities may again be defined by one or more via wall made up of a series of adjacent vias 360 that are spaced apart from the edges of openings 345A/345B and define the boundaries on one or more sides of the cavity/cavities within which the PCB substrate/dielectric material 350 may be contained. Again, these one or more cavities may instead by defined by a continuous structure, such as a solid wall comprising an electrically conductive material rather than a series of spaced vias 360 in alternative contemplated embodiments.

As with each of the previously discussed embodiments, one or more features of the printed circuit board 340 may be modified to tune the performance of the assembly 300 by only changing features of the printed circuit board 240. For example, although not every possible tuning dimension is specifically delineated on the figure, the length and/or width of one or more of the cavities that, in the depicted embodiment, are defined by rows of vias 360 may be modified to tune performance. Similarly, the length and/or width of one or both of the openings 345A/345B, such as the combined width of the two openings 345A/345B and strip 347, or respective widths W3 and/or W4, may be modified as another tuning parameter. The thickness of the substrate 350 of the printed circuit board 340 may also be varied as a tuning parameter. As another possible tuning parameter, one or more dimensions of the strip 347 extending between openings 345A/345B, such as the width of the strip 347, may be modified as yet another tuning parameter of the printed circuit board 340.

It should be understood that whereas preferred embodiments may be used in connection with vehicle sensors, such as vehicle RADAR modules or the like, the principles disclosed herein may be used in a wide variety of other contexts, such as other types of RADAR assemblies, including such assemblies used in aviation, maritime, scientific applications, military, and electronic warfare. Other examples include point-to-point wireless links, satellite communication antennas, other wireless technologies, such as 5G wireless, and high-frequency test and scientific instrumentation. Thus, the principles disclosed herein may be applied to any desired communication sub-system and/or high-performance sensing and/or imaging systems, including medical imaging, security imaging and stand-off detection, automotive and airborne radar and enhanced passive radiometers for earth observation and climate monitoring from space.

The foregoing specification has been described with reference to various embodiments and implementations. However, one of ordinary skill in the art will appreciate that various modifications and changes can be made without departing from the scope of the present disclosure. For example, various operational steps, as well as components for carrying out operational steps, may be implemented in various ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

Those having skill in the art will appreciate that many changes may be made to the details of the above-described embodiments without departing from the underlying principles of the invention. The scope of the present inventions should, therefore, be determined only by the following claims.

The invention claimed is:

1. A waveguide antenna assembly, comprising:
a waveguide comprising a waveguide groove defined by opposing waveguide groove structures;
an antenna structure operably coupled with the waveguide; and
a printed circuit board operably coupled with the waveguide, wherein the printed circuit board comprises an electrically conductive top layer, an electrically conductive bottom layer, and a substrate positioned in between the electrically conductive top layer and the electrically conductive bottom layer, and wherein the electrically conductive top layer comprises an opening exposing the substrate, wherein the opening extends along the waveguide groove in between the opposing waveguide groove structures.

2. The waveguide antenna assembly of claim 1, wherein the waveguide and antenna structure are configured to be coupled with a plurality of different printed circuit boards to adjust one or more performance characteristics of the waveguide antenna assembly by adjusting one or more parameters of a printed circuit board to which the waveguide and antenna structure are coupled.

3. The waveguide antenna assembly of claim 2, wherein the one or more parameters comprises at least one of a dielectric constant of the substrate, a width of the opening exposing the substrate, a length of the opening exposing the substrate, and a thickness of the substrate.

4. The waveguide antenna assembly of claim 3, further comprising a cavity formed in the printed circuit board, wherein the cavity is at least partially defined by the electrically conductive bottom layer and on opposing sides of the cavity by one or more electrically conductive structures coupling the electrically conductive bottom layer with the electrically conductive top layer.

5. The waveguide antenna assembly of claim 4, wherein the one or more electrically conductive structures comprises a row of adjacent vias defining a via wall.

6. The waveguide antenna assembly of claim 4, wherein the one or more parameters further comprises at least one of a width of the cavity and a length of the cavity.

7. The waveguide antenna assembly of claim 2, wherein the waveguide and the antenna structure are both formed in a single, unitary structure.

8. The waveguide antenna assembly of claim 7, wherein the single, unitary structure comprises at least one of a diecast waveguide antenna block and an injection molded waveguide antenna block.

9. The waveguide antenna assembly of claim 1, wherein the opposing waveguide groove structures comprise one or more opposing rows of posts.

10. The waveguide antenna assembly of claim 1, further comprising an array of electromagnetic band-gap structures formed within the opening.

11. The waveguide antenna assembly of claim 10, wherein the array of electromagnetic band-gap structures comprises a plurality of electrically conductive rectangular structures positioned on a top surface of the substrate and comprising a via extending through the substrate to couple with the electrically conductive bottom layer of the printed circuit board.

12. The waveguide antenna assembly of claim 11, wherein the waveguide and antenna structure are configured to be coupled with a plurality of different printed circuit boards to adjust one or more performance characteristics of the waveguide antenna assembly by adjusting one or more parameters of a printed circuit board to which the waveguide and antenna structure are coupled, and wherein the one or more parameters comprises at least one of a dielectric constant of the substrate, a width of the opening exposing the substrate, a length of the opening exposing the substrate, a thickness of the substrate, and a pattern of the array of electromagnetic band-gap structures.

13. A vehicle sensor antenna assembly, comprising:
a waveguide block comprising:
a waveguide groove;
an antenna slot extending along an axis of the waveguide groove, wherein the antenna slot is configured to deliver electromagnetic radiation therethrough as part of a signal for a vehicle sensor; and
a printed circuit board coupled with the waveguide block and forming a wall of the waveguide groove, wherein the printed circuit board comprises:
a first metallic layer;
a second metallic layer;
a substrate positioned in between the first metallic layer and the second metallic layer; and
an elongated opening formed in the first metallic layer adjacent to the waveguide groove to expose the substrate therethrough.

14. The vehicle sensor antenna assembly of claim 13, wherein the printed circuit board is removably coupleable to the waveguide block to allow any of a plurality of other printed circuit boards having differing characteristics used to tune a performance of the vehicle sensor by changing the characteristics of the printed circuit board alone.

15. The vehicle sensor antenna assembly of claim 13, further comprising a dielectric cavity formed in the substrate.

16. The vehicle sensor antenna assembly of claim 15, wherein the dielectric cavity is formed, at least in part, by a first row of conductive vias extending between the first metallic layer and the second metallic layer on a first side of the dielectric cavity and a second row of conductive vias extending between the first metallic layer and the second metallic layer along a second side of the dielectric cavity opposite the first side of the dielectric cavity.

17. The vehicle sensor antenna assembly of claim 16, wherein the printed circuit board is removably coupleable to the waveguide block to allow any of a plurality of other printed circuit boards having differing tuning characteristics used to tune a performance of the vehicle sensor by changing the tuning characteristics of the printed circuit board alone, and wherein the tuning characteristics comprise a dielectric constant of the substrate, a width of the elongated opening exposing the substrate, a length of the elongated opening exposing the substrate, a thickness of the substrate, a width of the dielectric cavity, and a length of the dielectric cavity.

18. The vehicle sensor antenna assembly of claim 13, wherein the waveguide groove is formed by one or more opposing rows of posts.

19. The vehicle sensor antenna assembly of claim 13, further comprising an array of electromagnetic band-gap structures formed in the elongated opening.

20. The vehicle sensor antenna assembly of claim 19, wherein the array of electromagnetic band-gap structures comprises a mushroom shape comprising an enlarged head protruding from a surface of the substrate opposite from the second metallic layer and a relatively narrower stem extending through the substrate to the second metallic layer.

\* \* \* \* \*